United States Patent [19]
Okabe et al.

[11] Patent Number: 6,114,207
[45] Date of Patent: Sep. 5, 2000

[54] METHOD OF PRODUCING A SEMICONDUCTOR DEVICE

[75] Inventors: Yoshifumi Okabe, Anjo; Mitsuhiro Kataoka, Kariya; Yutaka Tomatsu, Okazaki, all of Japan

[73] Assignee: Denso Corporation, Kariya, Japan

[21] Appl. No.: 09/244,605

[22] Filed: Feb. 10, 1999

Related U.S. Application Data

[62] Division of application No. 08/847,599, Apr. 25, 1997, Pat. No. 5,877,527.

[30] Foreign Application Priority Data

Apr. 26, 1996 [JP] Japan .................................. 8-108142

[51] Int. Cl.[7] .................................................. H01L 29/792
[52] U.S. Cl. ......................... 438/270; 438/272; 257/328; 257/329; 257/330; 257/335
[58] Field of Search .................................... 438/270, 272; 257/328–330, 335

[56] References Cited

U.S. PATENT DOCUMENTS

| | | |
|---|---|---|
| 4,970,173 | 11/1990 | Robb . |
| 5,124,764 | 6/1992 | Mori . |
| 5,155,052 | 10/1992 | Davies . |
| 5,248,627 | 9/1993 | Williams . |
| 5,250,449 | 10/1993 | Kuroyanagi et al. . |
| 5,298,780 | 3/1994 | Harada . |
| 5,460,985 | 10/1995 | Tokura et al. . |
| 5,460,986 | 10/1995 | Tam et al. . |
| 5,470,770 | 11/1995 | Takahashi et al. . |
| 5,473,176 | 12/1995 | Kakumoto . |
| 5,714,781 | 2/1998 | Yamamoto et al. . |
| 5,747,851 | 5/1998 | Tomatsu et al. . |
| 5,776,812 | 7/1998 | Takahashi et al. . |
| 5,780,324 | 7/1998 | Tokura et al. . |

FOREIGN PATENT DOCUMENTS

| | | |
|---|---|---|
| 56-96865 | 8/1981 | Japan . |
| 60-28271 | 2/1985 | Japan . |

OTHER PUBLICATIONS

Dialog File 347: JAPIO English Abstract of JP56–96865, Aug. 1981.

*Primary Examiner*—Charles Bowers
*Assistant Examiner*—David S Blum
*Attorney, Agent, or Firm*—Pillsbury Madison & Sutro LLP

[57] ABSTRACT

In a semiconductor device having a substrate, a p-type semiconductor layer, an n-type channel well region, a p-type lightly doped source region, and a source electrode formed on the substrate in this order, a p-type heavily-doped source region, an impurity concentration of which is higher than that of the lightly-doped source region, is formed in a surface region of the lightly-doped source region. The source electrode is formed to contact the heavily-doped source region. As a result, a punch through phenomenon between the p-type source region and the p-type semiconductor layer through the n-type channel well region can be prevented without increasing in the On resistance of the semiconductor device.

9 Claims, 12 Drawing Sheets

METHOD OF PRODUCING A SEMICONDUCTOR DEVICE

CROSS REFERENCE TO RELATED APPLICATION

This is a division of application Ser. No. 08/847,599, filed Apr. 25, 1997 now U.S. Pat. No. 5,877,527.

This application is based upon and claims the benefit of priority of the prior Japanese Patent Application No. 8-108142 filed on Apr. 26, 1996, the contents of which are incorporated herein by reference.

BACKGROUND OF THE INVENTION

1. Field of the Invention

The present invention relates to a semiconductor device and a method of producing the same.

2. Related Arts

Figure 28:
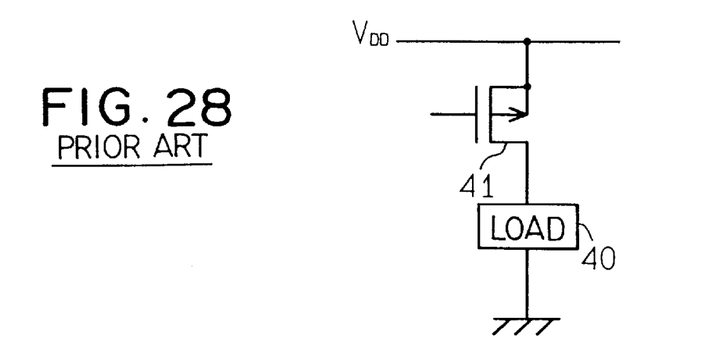
FIGS. 28 to 30 are diagrams showing several types of connection of a power MOSFET.
Figure 29:
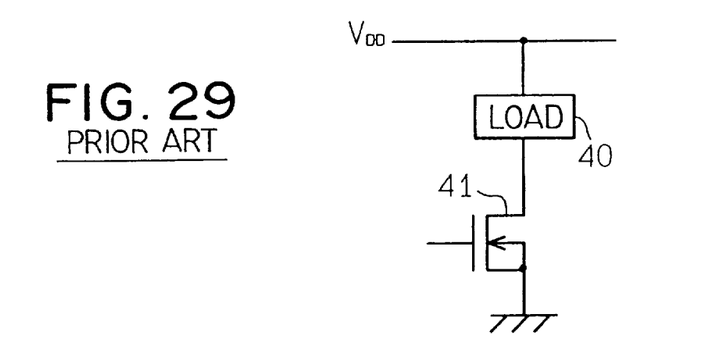

When connecting a power metal oxide semiconductor field effect transistor (a power MOSFET) to a load, there are two types of connection, i. e., a high side connection shown in FIG. 28 and a low side connection shown in FIG. 29. In the high side connection, a power MOSFET 41 is disposed between a power supply $V_{DD}$ and a load 40. In this connection, even if the load 40 itself is short-circuited to the earth, the power MOSFET 41 can control current flowing through the load. Therefore, in many cases, the high side connection is adopted because of high reliability.

Figure 30:
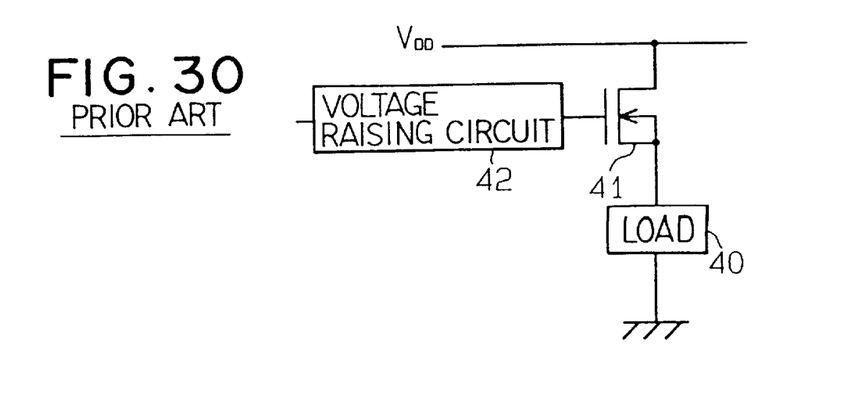

Especially, a p-channel power MOSFET is suitable for the high side connection, because the p-channel power MOSFET is turned ON when a gate electric potential is controlled to be negative with respect to a source electric potential. However, the ON resistance of the p-channel power MOSFET is two or three times higher than that of an n-channel power MOSFET if the chip sizes thereof are the same. To obtain low ON resistance of the p-channel power MOSFET, it is effective to increase the chip size of the MOSFET. However, large chip size results in high cost. Because of this, at present, there is a case where the n-channel power MOSFET having low ON resistance is used in the high side connection as shown in FIG. 30. In the case where the n-channel power MOSFET is arranged in the high side connection, it is necessary to employ a voltage rising circuit 42 for raising the gate electric potential of the n-type channel power MOSFET, because the n-type channel power MOSFET is not turned ON unless a gate electric potential is higher than a source electric potential. The provision of such voltage rising circuit 42 results in high cost on its system design and the like. Accordingly, in the case where the n-channel power MOSFET is more advantageous in cost than that of the p-channel power MOSFET having high ON resistance, the n-channel power MOSFET is likely to be employed.

Here, if the p-type channel power MOSFET having low ON resistance is obtained, since the p-channel power MOSFET does not need the voltage rising circuit or the like as shown in FIG. 28, a power MOSFET high side switch having a simple system structure can be realized.

Recently, an n-channel power MOSFET, in which resistance component associated with junction field effect transistor (JFET) parasitically caused in the power MOSFET is lowered by forming a groove in a surface of a silicon substrate, has been proposed. In addition, in this n-channel power MOSFET, a semiconductor fine processing technique is applied to reduce a size of a unit cell of the power MOSFET. As a result, degree of integration is increased, resulting in decrease of the ON resistance.

For example, JP-A-56-96865 and JP-A-60-28271 disclose the n-channel power MOSFET utilizing a local oxidation of silicon (LOCOS) technique. More concretely, a local oxide (LOCOS) layer is formed on a surface of a silicon substrate, and then, double diffusion layers are formed by utilizing the LOCOS layer as a diffusion mask. Thereafter, the LOCOS layer is removed to form a silicon groove, and a gate oxide layer and a gate electrode are formed on the silicon groove.

To form the n-channel power MOSFET, arsenic (As) ions are usually implanted to form a shallow source diffusion layer which is one of the double diffusion layers.

By utilizing the above mentioned technique, the unit cell size of the n-channel power MOSFET is reduced and simultaneously the ON resistance is lowered.

However, in the case where the above mentioned structure is applied to a p-channel power MOSFET, there arise the following problems.

That is to say, as impurities for forming a source diffusion layer of the p-channel power MOSFET, boron (B) ions having a diffusion coefficient larger than that of As ions are utilized in place of As ions.

In general, after forming the source diffusion layer, there exist some heat treatment steps which inevitably cause further diffusion of the source diffusion layer. In particular, in the case of the p-channel power MOSFET with the groove, because the diffusion coefficient of B ions is large, a diffusion depth of B ions becomes deep during the heat treatment steps such as gate oxidation, gate formation, and the like. As a result, a thickness of a channel region becomes small, giving rise to a punch through phenomenon.

To prevent the punch through phenomenon, it is effective to reduce the impurity concentration of boron ions in the source diffusion layer. Accordingly, the diffusion depth of boron ions becomes shallow, resulting in a shallow junction. In this case, however, the contact resistance between the source diffusion layer and a source electrode made of aluminum or the like increases, so that the ON resistance of the p-channel power MOSFET increases as well.

SUMMARY OF THE INVENTION

The present invention has been made in view of the above mentioned problems and objects of the present invention are to provide a semiconductor device, in particular a p-channel MOSFET, having a low ON resistance and capable of preventing a punch through phenomenon, and to provide a method of producing the same.

According to the present invention, a semiconductor device has a source region composed of a first source region and a second source region. The second source region is formed in a surface of the first source region to have a higher impurity concentration than that of the first source region. Further, a source electrode is formed to contact with the second source region.

Accordingly, because the contact resistance between the source electrode and the source region is decreased owing to the second source region having the higher impurity concentration, the ON resistance of the semiconductor device can be lowered. In addition, the impurity concentration of the first source region can be reduced irrespective of the contact resistance, so that a diffusion depth of the first source region can be made shallow. As a result, a channel length enough to prevent a punch through phenomenon is obtained. Thus, both prevention of the punch through phenomenon and decrease in the ON resistance can be realized at the same time.

Preferably, after forming the gate electrode on the semiconductor substrate through a gate insulation layer, the second source region is formed on the first source region by implantation of impurities. In this case, after forming the second source region, it is not necessary to expose the semiconductor device to a high temperature atmosphere. Therefore, the diffusion of the impurities in the second source region is prevented after forming itself, thereby keeping the source region shallow.

More preferably, the gate electrode is made of polycrystalline silicon, and is formed by implanting impurities into a non-doped polycrystalline silicon layer. In this case, the implantation of the impurities for forming the gate electrode and the implantation of the impurities for forming the second source region may be performed at the same time. As a result, the manufacturing process can be simplified.

To the contrary, after implanting the impurities to form the gate electrode, a mask layer may be formed on the gate electrode, and thereafter, the second source region may be formed by the implantation of the impurities. In this case, the mask layer prevents the impurities from invading the gate electrode in the process of forming the second source region, so that the implantation of the impurities into the gate electrode and into the second source region can be controlled, respectively. As a result, for example, when the polycrystalline silicon electrode is used as a resistor, the resistance thereof can be easily controlled to a desired value.

The semiconductor substrate may have a groove having sidewalls composed of the channel well region and the source region.

The present invention can be applied to a p-channel type transistor.

Other objects and features of the present invention will become more readily apparent from a better understanding of the preferred embodiments described below with reference to the following drawings.

DETAILED DESCRIPTION OF THE PREFERRED EMBODIMENTS

Embodiments according to the present invention will be described hereinunder with reference to the drawings.

Figure 1:
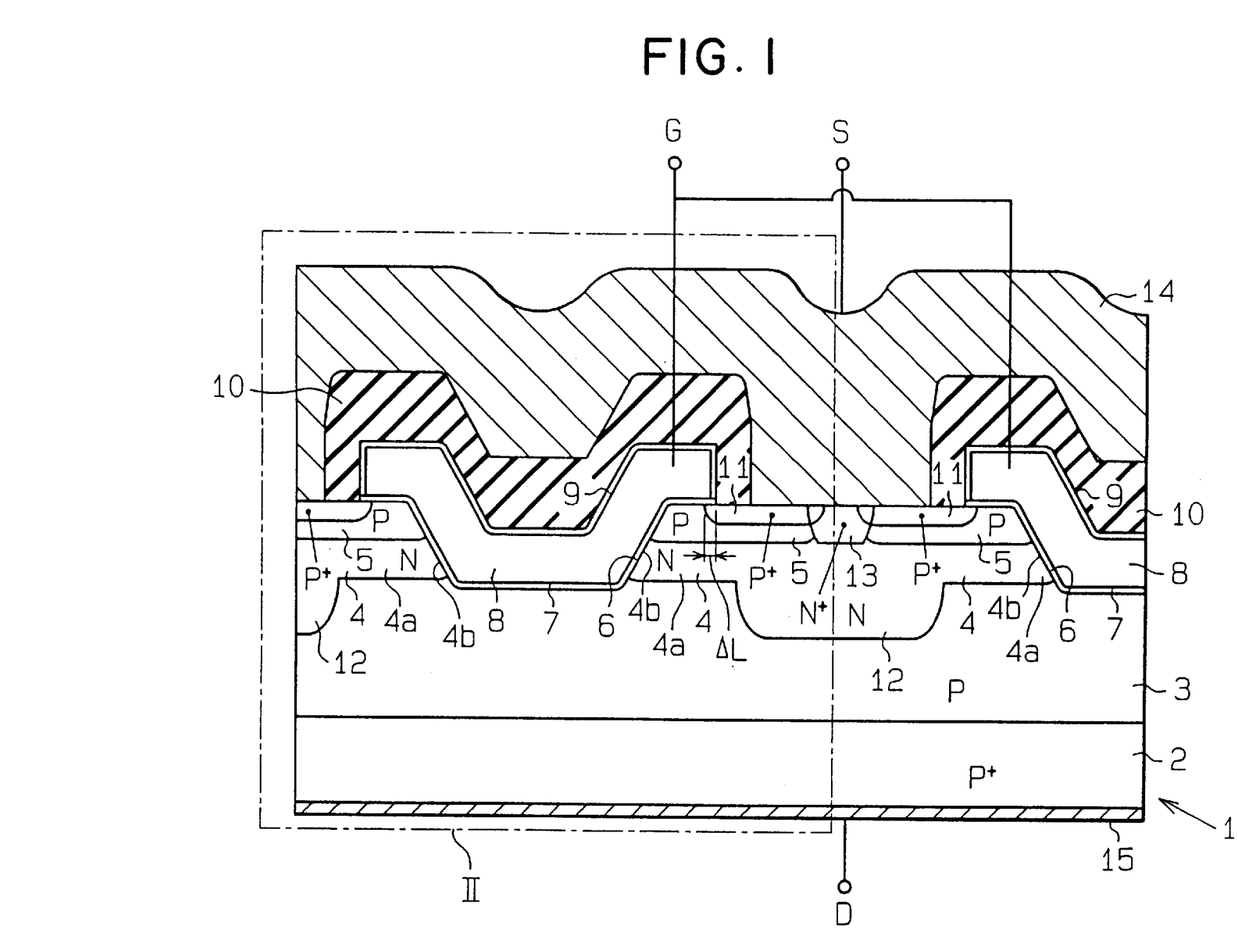
FIG. 1 is a cross-sectional view showing a p-channel power MOSFET according to a first embodiment of the present invention.

FIG. 1 shows a p-channel power MOSFET in a first embodiment.

A semiconductor device 1 has a $p^+$-type silicon substrate 2, and a p-type epitaxial layer 3 formed on the $p^+$-type silicon substrate 2. Thus, the semiconductor device 1 has the p-type epitaxial layer 3 being a first conductivity type semiconductor region on the upper surface side thereof.

Formed in an upper region of the p-type epitaxial layer 3 are a deep n-type body region 4, 12 composed of a channel well region 4 and a deep well region 12 and a shallow p-type lightly-doped source region 5 by a double-diffusion technique. The channel well region 4 functions as a channel forming region 4a.

Further, a groove 6 is formed on the semiconductor device 1 to have sloped sidewalls and a bottom on which the p-type epitaxial layer 3 is exposed. The channel forming region 4a (the region between the p-type epitaxial layer 3 and the p-type lightly-doped source region 5) is exposed on the sidewall of the groove 6 and a channel region 4b is defined in a surface portion of the channel forming region 4a exposing to the groove 6. The source region 5 is also exposed on the sidewall of the groove 6 as well. Further, the groove 6 has rounded corners between the sidewalls and the bottom, and between the sidewalls and the surface of the semiconductor device 1. This groove 6 having such a shape is formed by utilizing a local oxidation of silicon (LOCOS) technique described later. Here, the groove 6 is called as a concave, and the power MOSFET having the groove is called as a concave-type power MOSFET.

Furthermore, a thin silicon oxide layer 7 as a gate insulation layer is formed on the sidewalls and bottom of the groove 6 as well as on the lightly-doped source region 5 on the periphery of the groove 6. Disposed on the gate insulation layer 7 is a polycrystalline silicon gate electrode 8 covered by a silicon oxide layer 9. The silicon oxide layer 9 is covered by an interlayer insulation layer 10 made of phospho-silicate glass (PSG), borophospho-silicate glass (BPSG), or the like.

In this way, the deep n-type body region 4, 12 and the shallow p-type lightly-doped source region 5 are formed on the surface of the p-type epitaxial layer 3 by the double diffusion technique, while the polycrystalline silicon gate electrode 8 is arranged on the sidewall of the groove 6 so as to oppose the exposed surface of the channel well region 4 between the p-type source region 5 and the p-type epitaxial layer 3 through the gate insulation layer 7.

In a surface region of the source region 5 on which the polycrystalline silicon gate electrode 8 is not formed, a $p^+$-type region (a heavily-doped source region) 11 is formed.

In the first embodiment, a dose amount in the n-type channel well region 4 is approximately $4 \times 10^{13}$ atoms/cm$^2$, a dose amount in the p-type lightly-doped source region 5 is approximately $2 \times 10^{14}$ atoms/cm$^2$, and a dose amount in the $p^+$-type heavily-doped region 11 is approximately $1 \times 10^{15}$ atoms/cm$^2$.

In addition, the n-type deep well region 12 is formed in the p-type epitaxial layer 3 so as to be located below the channel well region 4, and an $n^+$-type region (a body contact region) 13 is formed over the deep well region 12.

A source electrode 14 made of aluminum-based alloy is formed on a main surface of the semiconductor device 1 to make contact with the $p^+$-type heavily-doped source region 11 and the $n^+$-type body contact region 13. On the other hand, a drain electrode 15 composed of titanium (Ti)/nickel (Ni)/gold (Au) laminated layers is formed on the surface of the $p^+$-type silicon substrate 2 (on a back surface of the semiconductor device 1) to make contact with the p+-type silicon substrate 2.

In this device, a voltage applied to the gate electrode 8 is changed to control the current flowing between the source electrode 14 and the drain electrode 15. At this time, because the p+-type heavily-doped source region 11 is disposed between the source electrode 14 and the lightly-doped source region 5, the ON resistance of the device is decreased. In more detail, in a current path of the source electrode 14→the lightly-doped source region 5→the channel forming region 4a (in more detail, the channel region 4b)→the p-type epitaxial layer 3→the p+-type silicon substrate 2→the drain electrode 15, because the p+-type heavily-doped source region 11 is formed between the lightly-doped source region 5 and the source electrode 14, the contact resistance therebetween is made small.

Next, a method of manufacturing the p-channel power MOSFET having the above mentioned constitution will be explained focusing on a part surrounded by a single-point chain line II in FIG. 1.

Figure 2:
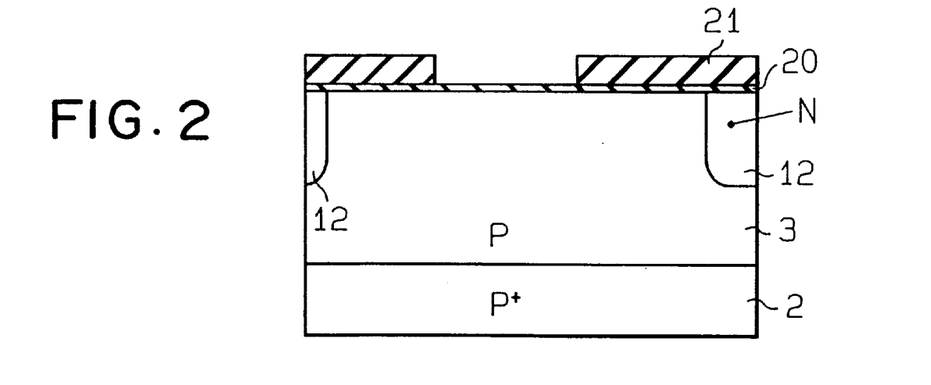
FIGS. 2 to 15 are cross-sectional views for explaining processes of manufacturing the p-channel power MOSFET, respectively, in the first embodiment.

As shown in FIG. 2, a p+-type silicon substrate (a wafer) 2 is prepared, and a p-type epitaxial layer 3 is grown on the p+-type silicon substrate 2. At a predetermined region in the p-type epitaxial layer 3, an n-type deep well region 12 is formed. Thereafter, a thermal oxidation layer 20 and a nitride layer 21 are subsequently formed on the semiconductor device 1, and the nitride layer 21 is patterned to form a pattern opened at an area to form a gate region by an well-known photo-etching technique.

Figure 3:
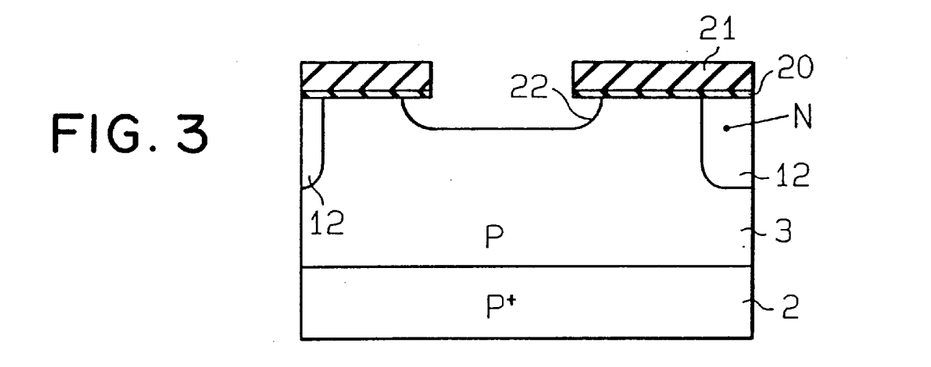

Successively, as shown in FIG. 3, the thermal oxidation layer 20 is also removed at the area to form the gate region by utilizing the patterned nitride layer 21 as a mask. The p-type epitaxial layer 3 is further etched by a dry-etching process through the thermal oxidation layer 20 and the nitride layer 21 to form a shallow depression 22.

Figure 4:
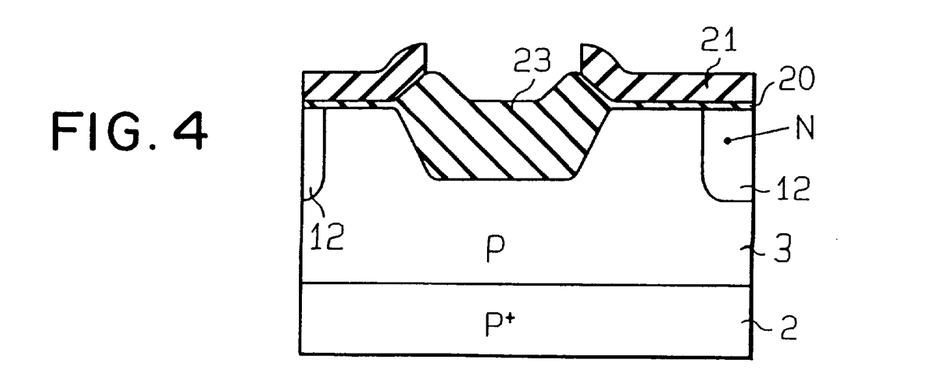

As shown in FIG. 4, a LOCOS process is performed to form a local oxide layer (a LOCOS layer) 23 having a required thickness on the shallow depression 22.

Figure 5:
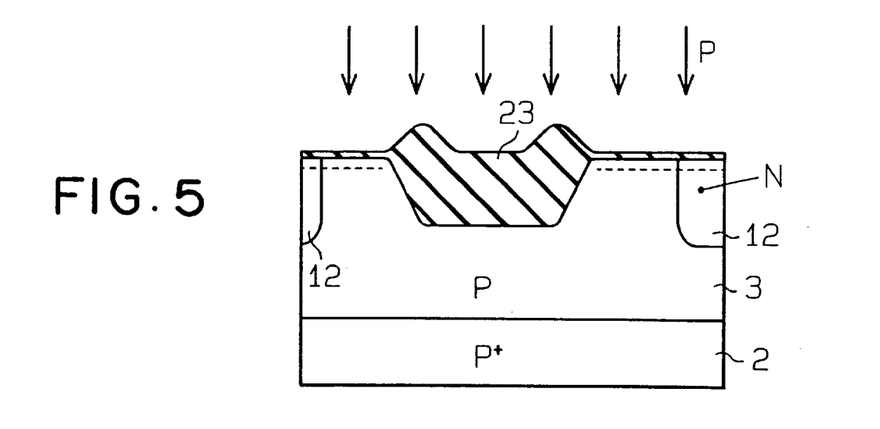

Then, as shown in FIG. 5, after removing the nitride layer 21, phosphorus (P) ions are implanted into the p-type epitaxial layer 3. In this process, the LOCOS layer 23 functions as a mask so as to self-align the implantation of phosphorus ions.

Figure 6:
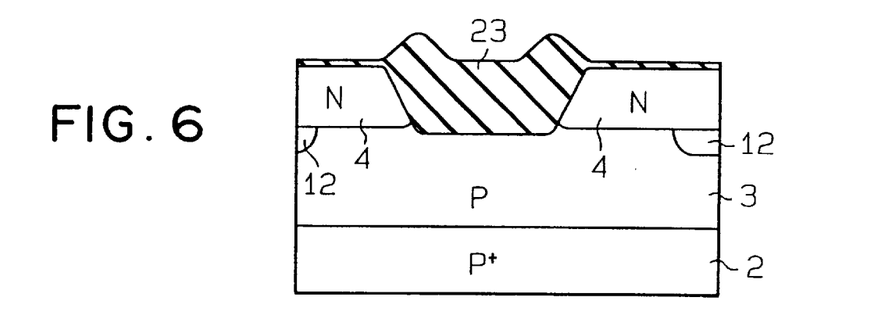

Subsequently, as shown in FIG. 6, an annealing treatment is performed with respect to the semiconductor device 1 in a nitrogen ($N_2$) atmosphere at 1050° C., so that phosphorus ions are diffused to the same depth as the bottom of the LOCOS layer 23 to form a channel well region 4. As a result, the channel well region 4 is defined.

Figure 7:
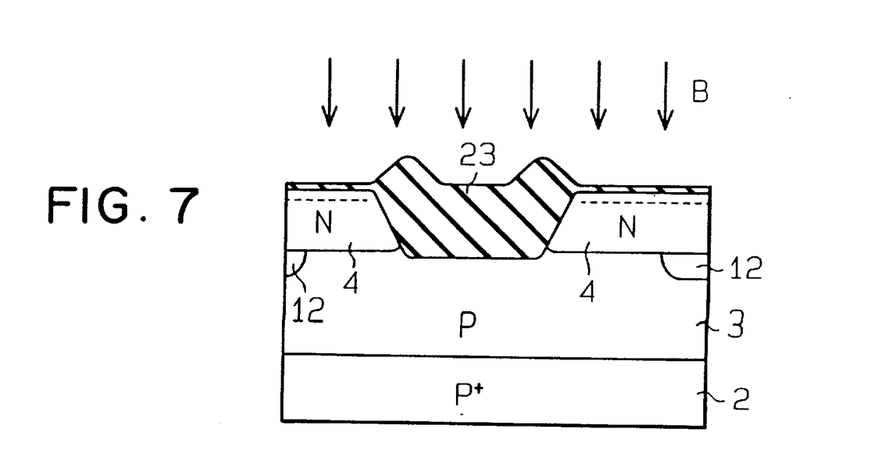

Into the channel well region 4, as shown in FIG. 7, boron ions are implanted so that a resultant region has a low dose amount while self-aligned by the LOCOS layer 23. The dose amount of boron ions is approximately $2 \times 10^{14}$ atoms/cm$^2$.

Figure 8:
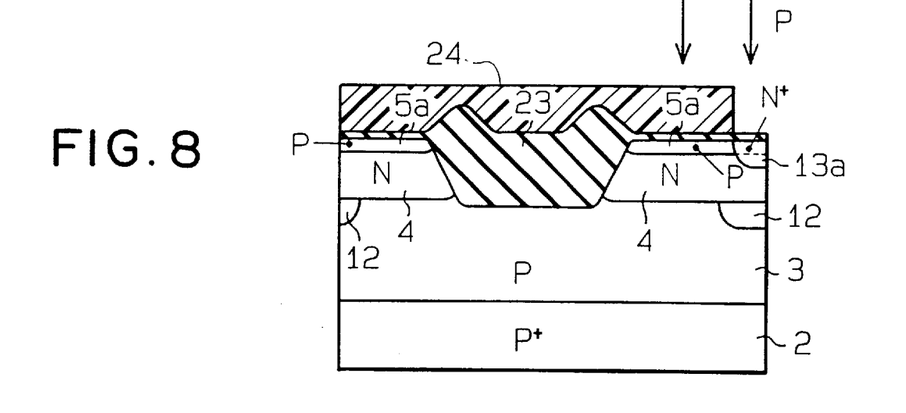

The annealing treatment is performed with respect to the semiconductor device 1 in the $N_2$ atmosphere at 900° C. for 30 minutes, whereby the implanted boron ions are activated to form the p-type lightly-doped region 5a. Moreover, as shown in FIG. 8, after a resist layer 24 is provided at a predetermined area on the LOCOS layer 23 as well as on the thermal oxidation layer 20, phosphorus ions are implanted again, thereby forming the N+-type body contact region 13a.

Figure 9:
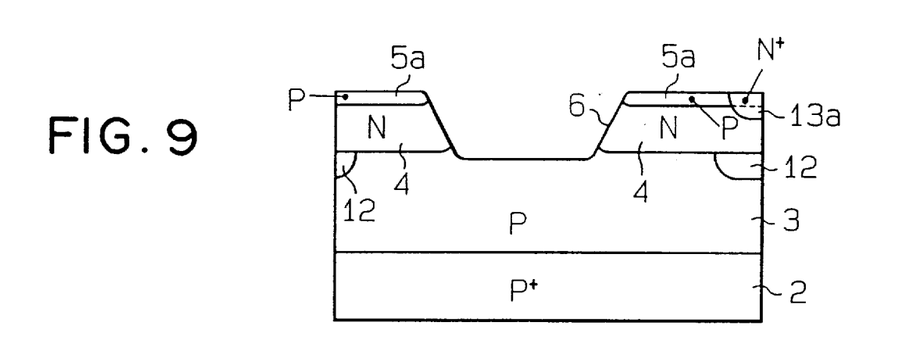

As shown in FIG. 9, the resist layer 24 and the LOCOS layer 23 respectively, are removed by a well-known etching technique so that the groove 6 is exposed. The required depth of the groove 6 can be obtained by controlling the depth of the depression 22, the amount of oxidation in the LOCOS process and the like.

Figure 10:
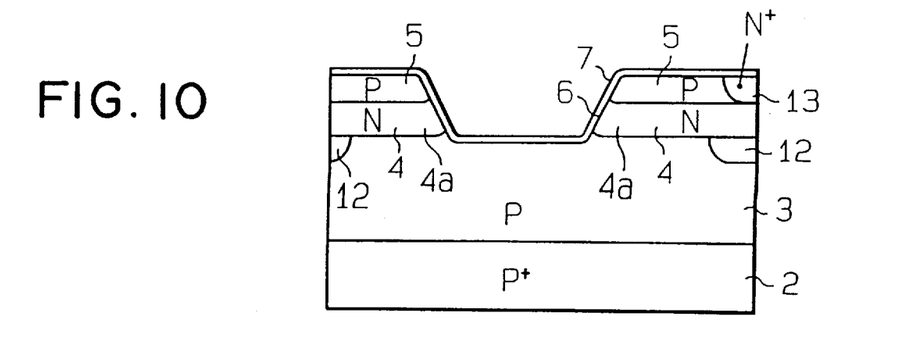

Next, as shown in FIG. 10, the silicon oxide layer 7 is formed to cause it to function as the gate insulation layer. This process is performed in a dry oxygen ($O_2$) atmosphere at 950° C.–1050° C. Simultaneously, the diffusion depth of boron ions becomes deep to define the p-type lightly-doped source region 5 and a channel forming region 4a.

Figure 11:
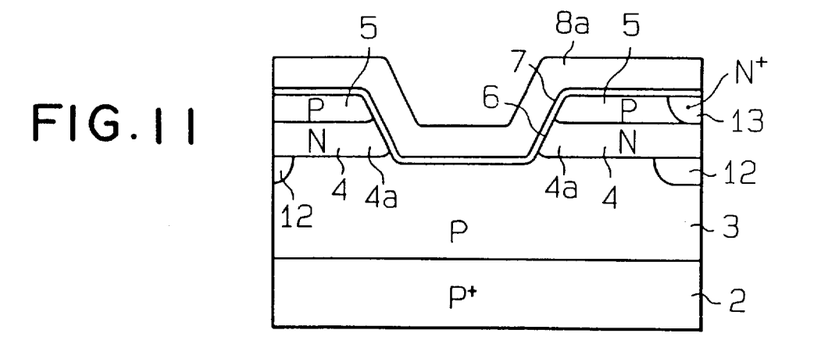

As shown in FIG. 11, a non-doped polycrystalline silicon layer 8a used as a gate electrode having a thickness of approximately 4000 Å is deposited on the silicon oxide layer 7 by a low pressure chemical vapor deposition (LP-CVD) method.

Figure 12:
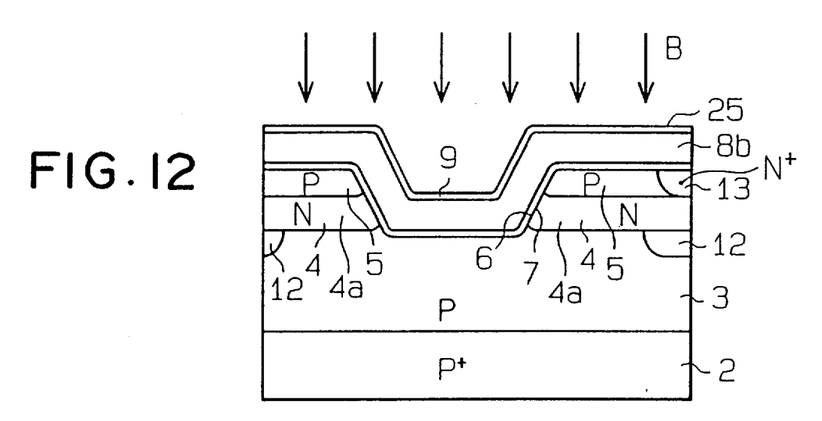

Next, as shown in FIG. 12, a thermal oxidation is performed to form a thermal oxidation layer 25 on the non-doped polycrystalline silicon layer 8a, and then, boron ions are implanted to the non-doped polycrystalline silicon layer 8a through the thermal oxidation layer 25. Thereafter, the heat treatment for activation is performed with respect to the semiconductor device 1 in the $N_2$ atmosphere at 900° C. for 30 minutes. Consequently, the non-doped polycrystalline silicon layer 8a changes to a p-type polycrystalline silicon layer 8b.

Figure 13:
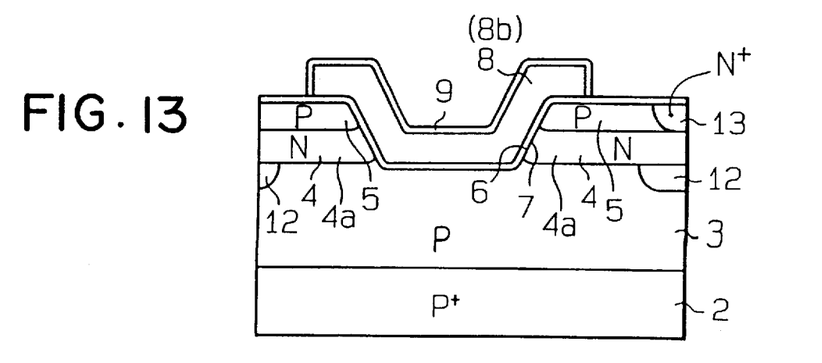

After removing the thermal oxidation layer 25, the p-type polycrystalline silicon layer 8b is patterned by a combination of the well-known photolithographic technique and the dry etching technique so that only a portion corresponding to the gate electrode remains. On the surface of the polycrystalline gate electrode 8 (p-type polycrystalline silicon layer 8b), a thermal oxidation layer 9 is formed by thermal oxidation as shown in FIG. 13.

Figure 14:
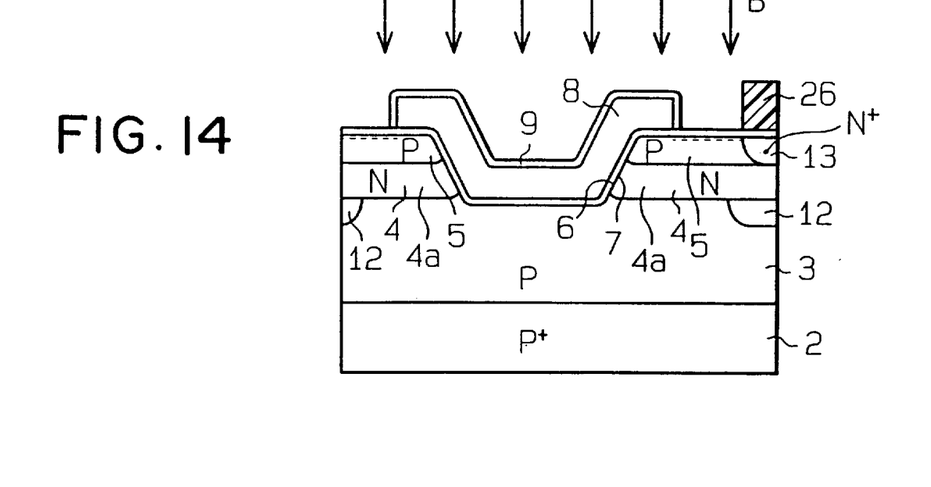

Next, as shown in FIG. 14, in a state that a resist layer 26 is disposed at a predetermined area, boron ions are implanted so that a resultant region has a high dose amount (approximately $1 \times 10^{15}$ atoms/cm$^2$).

Thereafter, an interlayer insulation layer (not shown, but corresponding to reference numeral 10 in FIG. 1) is formed, and the annealing treatment is performed with respect to the semiconductor device 1 in the $N_2$ atmosphere at 900° C.–950° C. This annealing treatment simultaneously serves as a reflow treatment for the interlayer insulation layer and as an annealing treatment for activating the heavily doped boron ions.

Figure 15:
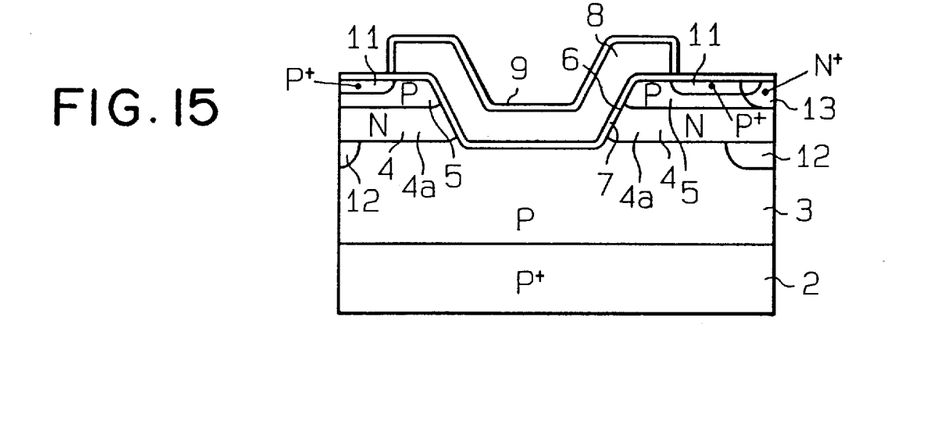

As a result, as shown in FIG. 15, a p+-type region (heavily-doped source region) 11 is defined, while the p-type lightly-doped and heavily-doped double diffusion layers 5 and 11 are defined. Here, as shown in FIG. 1, the p+-type heavily-doped source region 11 extends by a length ΔL from the side face of the polycrystalline silicon gate electrode 8 (in more detail, from the side face of the thermal oxidation 9) to the side of the groove 6.

Further, a source electrode 14 composed of aluminum thin layer is formed on the main surface of the semiconductor device 1, and then a drain electrode 15 composed of Ti/Ni/Au laminated layers is formed on the back surface of the semiconductor device 1.

In this way, the p-channel power MOSFET shown in FIG. 1 is manufactured. In the manufacturing processes, the impurity concentration in the lightly-doped source region 5 is controlled to be low to make the depth of the lightly-doped source region 5 shallow, thereby preventing a punch through phenomenon. That is to say, because the impurity concentration in the lightly-doped source region 5 is reduced so that the depth of the lightly-doped source region 5 is shallow, a channel length enough for preventing the punch through phenomenon can be ensured. At the same time, because the contact resistance between the source electrode 14 and the heavily-doped diffusion layer 11 is small, the ON resistance of the device can be reduced.

In this embodiment, after forming the silicon oxide layer 7 as the gate insulation layer, the polycrystalline gate electrode 8, and the thermal oxidation layer 9, the P$^+$-type heavily-doped source region 11 is formed. Therefore, after forming the P$^+$-type heavily-doped source region 11, no heat treatment is performed with respect to the semiconductor device 1 other than the annealing treatment for activating the heavily-doped source region 11 itself. Therefore, the diffusion of impurities in the P$^+$-type heavily-doped source region 11 does not progress after the definition of the heavily-doped source region 11, so that the P$^+$-type heavily-doped source region 11 and the lightly-doped source region 5 can keep those diffusion depths, respectively.

As mentioned above, the first embodiment has the following features.

(A) The p$^+$-type heavily-doped region 11 (the first conductivity type heavily-doped region), the impurity concentration of which is higher than that of the p-type lightly-doped source region 5, is formed in the surface portion of the lightly-doped source region 5, and the source electrode 14 is arranged so as to contact therewith. Accordingly, the contact resistance between the lightly-doped source region 5 and the source electrode 14 made of aluminum-based alloy can be lowered, resulting in decrease of the ON resistance. Further, the lightly-doped source region 5 can be made to have lowered impurity concentration so that the diffusion depth thereof becomes shallow. As a result, a channel length enough for preventing the punch through phenomenon can be obtained. Thus, prevention of the punch through phenomenon and decrease of the ON resistance can be realized at the same time. In addition, because the depth of the lightly-doped source region 5 is relatively shallow, the size of the source region 5 can be miniaturized. As a result, the unit cell size becomes small, resulting in improvement of the degree of integration and decrease of the ON resistance.

(B) In the above-mentioned manufacturing method, after forming the body region 4, 12 and the lightly-doped source region 5, the polycrystalline silicon layer 8a as the gate electrode and the thermal oxidation layer 9 are formed over the groove 7 through the silicon oxide layer 7 as the gate insulation layer. Thereafter, p$^+$-type heavily-doped region 11 is formed in the surface region of the lightly-doped source region 5 by the implantation of p-type impurities. That is to say, after forming the p$^+$-type heavily-doped region 11, the semiconductor device 1 is not exposed to a high temperature atmosphere. Consequently, the diffusion of impurities in the p$^+$-type heavily-doped region 11 is prevented after the heavily-doped region 11 is defined, thereby ensuring the shallow lightly-doped source region 5.

Next, a modified embodiment in which the present invention is applied to a trench gate type MOSFET will be described.

Figure 26:
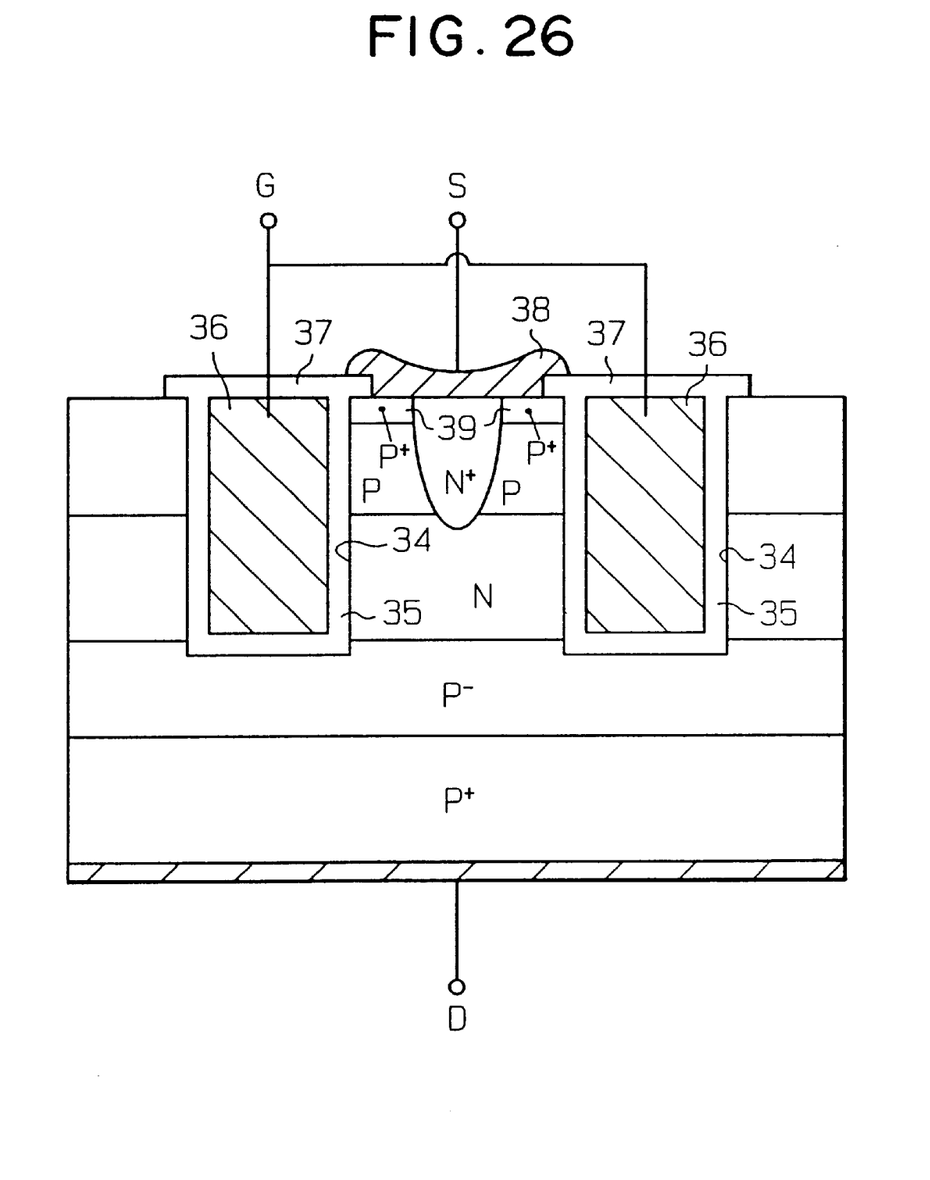
FIG. 26 is a cross-sectional view showing a trench gate type MOSFET according to a modified embodiment of the present invention.

In the trench gate type MOSFET, as shown in FIG. 26, after forming an n-type and p-type diffusion layers on a p$^-$/p$^+$ substrate, trenches 34 are formed by a reactive ion etching (RIE) technique. Before forming the trenches 34, an n-type and p-type epitaxial layers may be formed on the p$^-$/p$^+$ substrate in place of the n-type and p-type diffusion layers. Then, gate electrodes 36 are formed in the trenches through silicon oxide layers 35 which are gate insulation layers. The upper surfaces of the gate electrodes 36 are covered by a silicon oxide layer 37. A p$^+$-type region (a heavily-doped region) 39 is formed on the surface of the substrate, and a source electrode 38 is formed on the p$^+$-type heavily-doped region 39. In this trench gate type MOSFET, the same effects as those in the first embodiment can be attained.

Here, in the trench gate type MOSFET, in the case where the p$^+$-type heavily-doped region 39 is formed by means of the ion implantation process by utilizing the gate electrodes 36 as a mask, ions are implanted not only into the p$^+$-type heavily-doped region 39 but also into the silicon oxide layer 35 as the gate insulation layer. As a result, a breakdown of the gate may occur or durability of the gate insulation layer 35 may deteriorate. As opposed to this, in the p-channel power MOSFET in the first embodiment, as shown in FIG. 14, although the p$^+$-type heavily-doped region 11 is formed by means of the ion implantation by utilizing the gate electrode 8 as a mask, because the silicon oxide layer 7 as the gate insulation layer is entirely covered by the gate electrode 8, ions are not implanted into the silicon oxide layer 7. Therefore, in the case where the present invention is applied to the trench gate type MOSFET, it is necessary to prevent the above mentioned problem.

Next, a second embodiment will be explained focusing on differences with respect to the first embodiment.

In the second embodiment, as described in the first embodiment referring to FIGS. 2 to 11, after forming the lightly-doped source region 5, the silicon oxide layer 7 and the non-doped polycrystalline silicon layer 8a for the gate electrode are formed.

Figure 16:
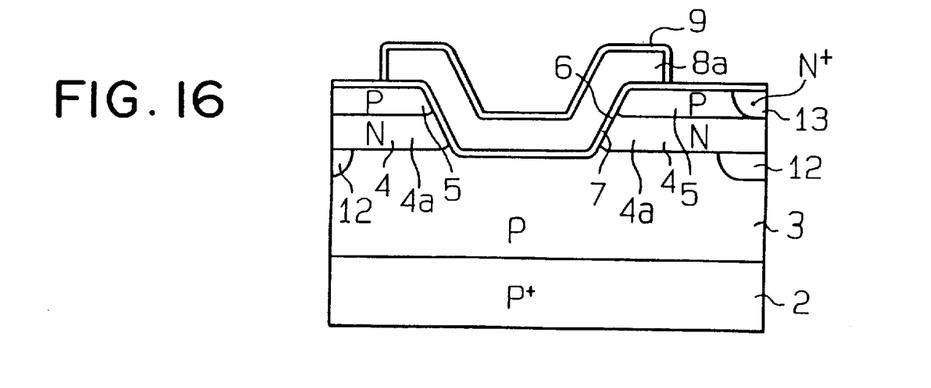
FIGS. 16 to 18 are cross-sectional views for explaining processes of manufacturing a p-channel power MOSFET, respectively, according to a second embodiment of the present invention.

Next, as shown in FIG. 16, the non-doped polycrystalline silicon layer 8a is patterned by an well-known photo-etching technique before the implantation of impurities, so that only a portion for the gate electrode remains.

Figure 17:
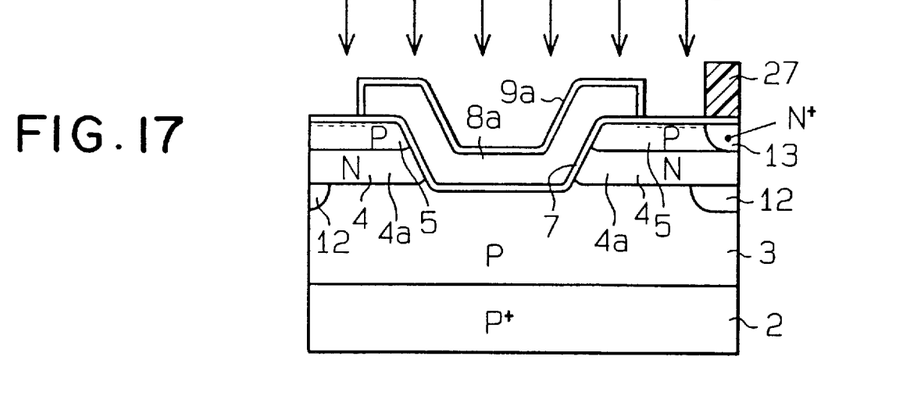

The silicon oxide layer 9 is formed on the surface of the non-doped polycrystalline silicon layer 8a by thermal oxidation. Thereafter, as shown in FIG. 17, a resist layer 27 is disposed at a predetermined area on the silicon oxide layer 7, and boron ions are implanted to the surface region of the lightly-doped source region 5 using the patterned non-doped polycrystalline silicon layer 8a and the resist layer 27 as a mask. At the same time, boron ions are implanted into the non-doped polycrystalline silicon layer 8a, thereby forming the p-type silicon gate electrode 8.

Figure 18:
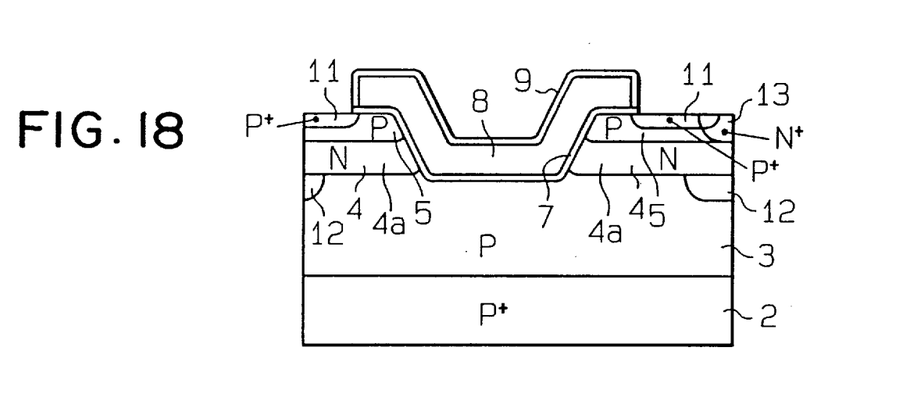

As shown in FIG. 18, the resist layer 27 and the silicon oxide layer 7 except a portion laid under the p-type silicon gate electrode 8 are removed. Then, the interlayer insulation layer 10 shown in FIG. 1 is formed on the semiconductor device 1, and the reflow treatment is performed for the interlayer insulation layer 10. This reflow treatment simultaneously serves as the annealing treatment for activating and forming the p$^+$-type heavily-doped source region 11 (after implanting boron ions).

Finally, as mentioned in the first embodiment referring to FIG. 1, the source electrode 14 made of aluminum-based alloy is formed on the main surface of the semiconductor device 1, and the drain electrode 15 is formed on the back surface of the semiconductor device 1.

Thus, the p-channel power MOSFET shown in FIG. 1 is fabricated.

In the second embodiment, the implantation of boron ions for forming the p-type silicon gate electrode 8 can be performed simultaneously with the implantation of boron ions for forming the p$^+$-type heavily-doped source region 11. Therefore, the manufacturing processes can be simplified compared to the first embodiment.

In the case where the p-channel power MOSFET employs an n-type polycrystalline silicon gate electrode usually employed in the n-channel power MOSFET, an absolute value of a threshold voltage VT becomes large. Therefore, in the first and second embodiments, the p-type (boron ions added) polycrystalline silicon gate electrode is adopted instead of the n-type polycrystalline silicon gate electrode so that the absolute value of the threshold voltage VT becomes smaller based on a difference in work function therebetween. In the second embodiment, the process for forming the p-type polycrystalline silicon gate electrode is simplified, and the underlying gate insulation layer 7 is prevented from the p-type impurities in the gate electrode due to the diffusion during the following processes.

Next, a third embodiment will be explained focusing on differences with respect to the first embodiment.

The manufacturing processes up to forming the non-doped polycrystalline silicon layer 8a for the gate electrode are the same as the first embodiment as described referring to FIGS. 2 to 11.

Figure 19:
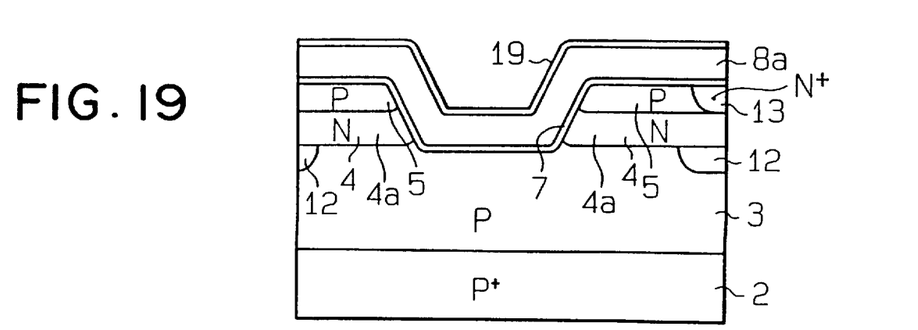
FIGS. 19 to 25 are cross-sectional views for explaining processes of manufacturing a p-channel power MOSFET, respectively, according to a third embodiment of the present invention.

In the third embodiment, as shown in FIG. 19, a thermal oxidation layer 19 is formed on the non-doped polycrystalline silicon layer 8a.

Figure 20:
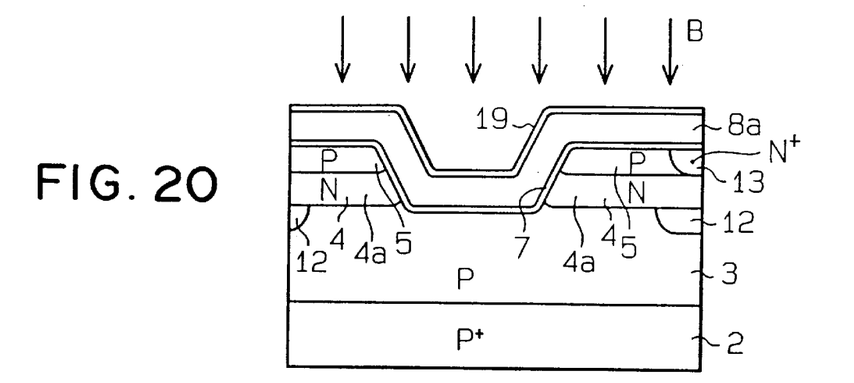

Thereafter, as shown in FIG. 20, boron ions are implanted into the polycrystalline silicon layer 8a to change it into the p-type polycrystalline silicon layer 8b.

Figure 21:
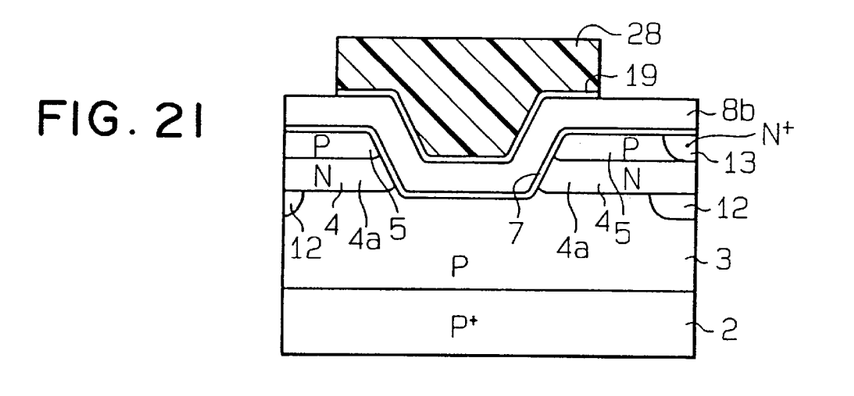

Then, as shown in FIG. 21, a resist 28 is formed at a predetermined area on the p-type polycrystalline silicon layer 8b through the thermal oxidation layer 19 by the well-known photolithographic technique. In this case, although the thermal oxidation layer 19 is left so that the resist 28 is formed thereon, another oxide layer may be formed on the p-type polycrystalline silicon layer 8b after removing the thermal oxidation layer 19.

Figure 22:
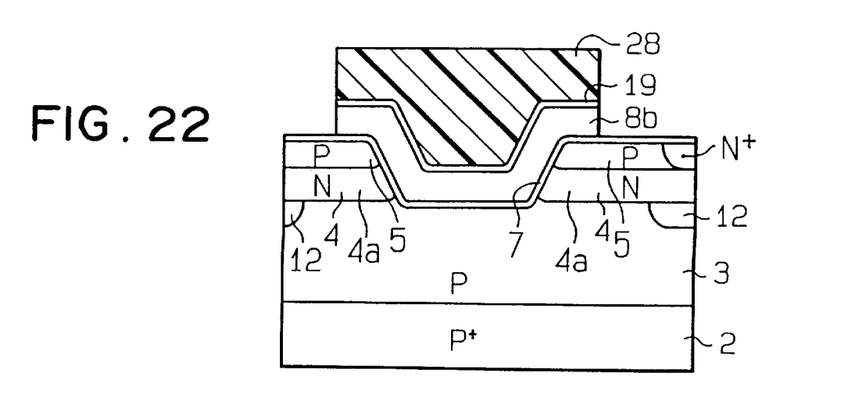

As shown in FIG. 21, the thermal oxidation layer 19 is etched by using the resist 28 as a mask, and successively, as shown in FIG. 22, the p-type polycrystalline silicon layer 8b is etched in the same way. As a result, the gate electrode having the p-type polycrystalline silicon layer 8b and the thermal oxidation layer 19 formed thereon is obtained.

Figure 23:
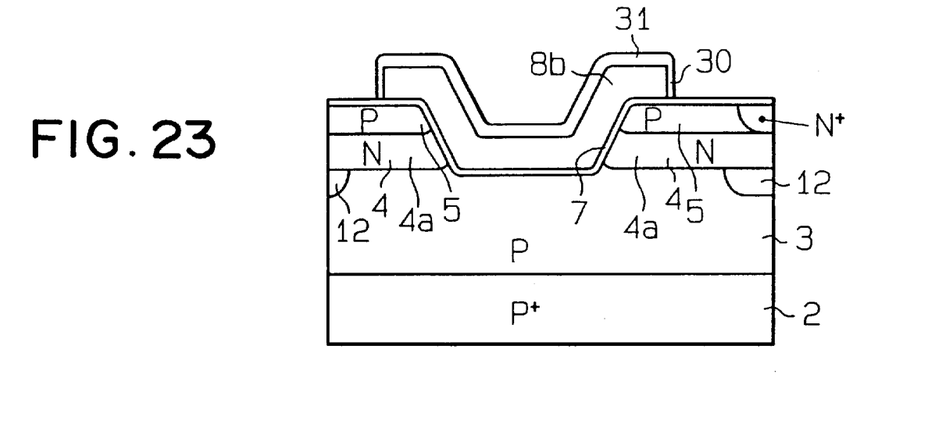

Further, as shown in FIG. 23, after removing the resist 28, an oxide layer 30 is formed to cover the side faces of the p-type polycrystalline silicon layer 8b by thermal oxidation. In this process, the thermal oxidation layer 19 on the p-type polycrystalline silicon layer 8b is further thickened, thereby forming a thick oxide layer 31. The oxide layer 31 has a thickness enough to prevent invasion of ions in the following ion implantation process, i.e., a thickness larger than the projected range of implanted ions, so that the oxide layer 31 can function as a mask in the ion implantation process.

Figure 24:
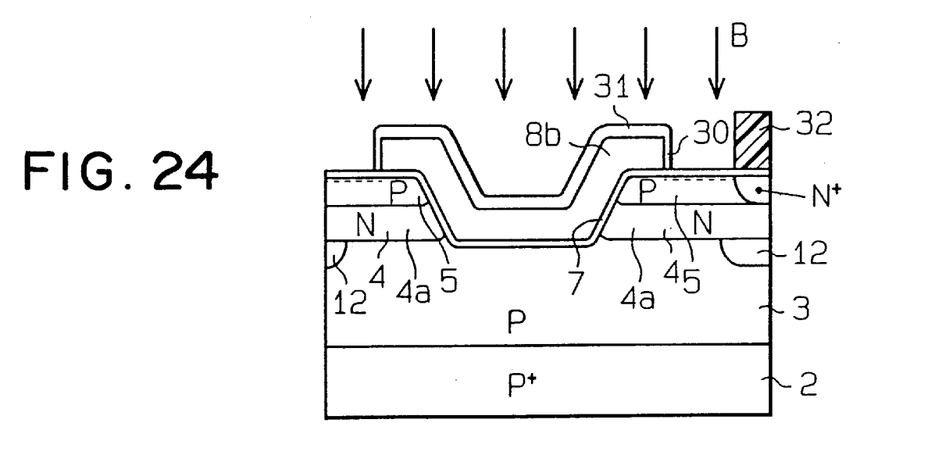

As shown in FIG. 24, after forming a resist 32, boron ions are implanted into the source region 5.

In this process, the upper face of the p-type polycrystalline silicon layer 8b is covered by the thick oxide layer 31 which functions as the mask. Therefore, when an acceleration voltage for implanting ions is selected appropriately, boron ions are prevented from being implanted into the p-type polycrystalline silicon layer 8b.

Figure 25:
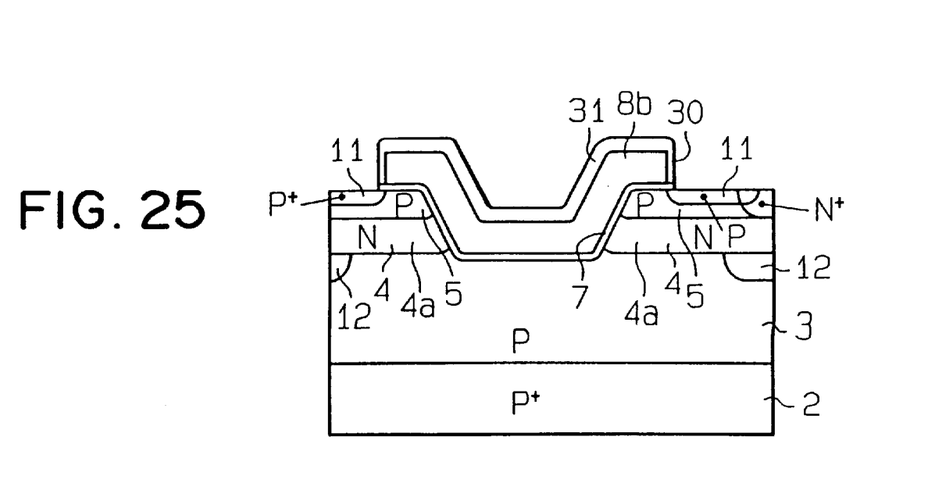

Furthermore, as shown in FIG. 25, the resist 32 and the silicon oxide layer 7 except the portion forming the gate insulation layer are removed. Thereafter, the interlayer insulation layer 10 shown in FIG. 1 is formed, and then, the reflow treatment is performed for the interlayer insulation layer 10. During this reflow treatment, boron ions implanted are activated to form the p$^+$-type heavily-doped source region 11.

Finally, the source electrode 14 made of aluminum alloy is formed on the main surface of the semiconductor device 1, and the drain electrode 15 is formed on the back surface of the semiconductor device 1.

In the third embodiment, the implantation processes of boron ions for the p-type polycrystalline silicon gate electrode 8 and for the p$^+$-type heavily-doped source region 11 can be performed, respectively. As a result, for example, in the case where the p-type polycrystalline silicon gate electrode is employed as a resistor, a value of resistance of the p-type polycrystalline silicon gate electrode can be easily controlled.

While the present invention has been shown and described with reference to the foregoing preferred embodiments, it will be apparent to those skilled in the art that changes in form and detail may be made therein without departing from the scope of the invention as defined in the appended claims.

For example, the present invention can be applied to an n-channel transistor in addition to a p-channel transistor. In the case where arsenic (As) ions, the diffusivity of which is smaller than that of boron ions, are employed to form a heavily-doped source region as well as a lightly-doped source region in the n-channel transistor, it is easy to make the diffusion depth of the source region shallow so as to form a shallow junction of the source region.

Figure 27:
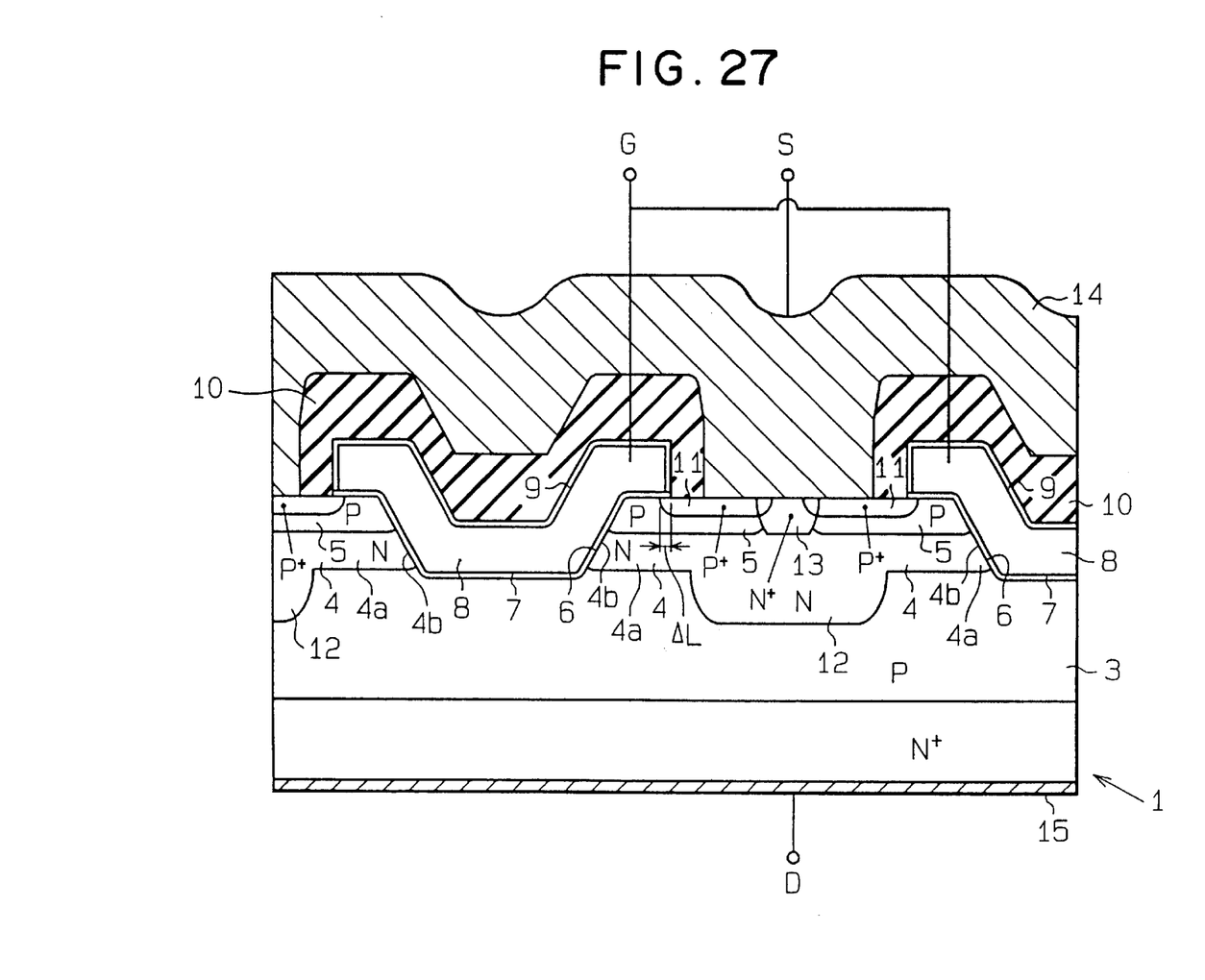
FIG. 27 is a cross-sectional view showing an insulated gate bipolar transistor (IGBT) according to a modified embodiment of the present invention.

Further, the present invention may be applied to an insulated gate bipolar transistor (IGBT) in addition to the MOSFET. FIG. 27 shows a p-channel IGBT to which the present invention is applied.

In the above mentioned embodiments, although the drain electrode is formed on the back surface of the semiconductor substrate, an up-drain type device can be adopted as well.

Although the semiconductor device shown in FIG. 1 has the groove 6, the present invention may be applied to other semiconductor device having no groove.

Furthermore, it is possible to increase the diffusion depth of the p$^+$-type heavily-doped source region 11 not to exceed the diffusion depth of the lightly-doped source region 5.

Variations such as those described above are to be understood as being within the scope of the present invention as defined by the appended claims.

What is claimed is:

1. A method of producing a semiconductor device having a source and a drain electrodes, the method comprising:

preparing a semiconductor substrate having a semiconductor layer of a first conductivity type on a surface thereof;

forming a channel well region of a second conductivity type and a first source region of the first conductivity type in a surface region of the semiconductor layer;

forming a gate insulation layer on a surface portion of the channel well region;

forming a gate electrode on the surface portion of the channel well region through the gate insulation layer;

forming a second source region of the first conductivity type in a surface region of the first source region, the second source region having a higher impurity concentration than that of the first source region; and forming the source electrode which contacts the second source region.

2. A method of producing a semiconductor device according to claim 1, wherein;

the second source region is formed in the surface region of the first source region by implantation of impurities of the first conductivity type.

3. A method of producing a semiconductor device according to claim 1, before forming the gate insulation layer, further including forming a groove having sidewalls exposing the channel well region and the first source region, wherein the gate insulation layer is formed on the groove.

4. A method of producing a semiconductor device according to claim 1, wherein;

the first conductivity type is p-type and the second conductivity type is n-type.

5. A method of producing a semiconductor device according to claim 2, wherein;

forming the gate electrode includes forming a non-doped polycrystalline silicon layer over a surface of the semiconductor layer, and a step of implanting the impurities of the first conductivity type into the non-doped polycrystalline silicon layer, thereby forming the gate electrode.

6. A method of producing a semiconductor device according to claim 5, wherein;

implanting the impurities into the non-doped polycrystalline silicon layer and the step of forming the second source region are performed at the same time.

7. A method of producing a semiconductor device according to claim 2, before forming the second source region, the method further including;

forming a mask layer on the gate electrode to have a thickness enough to prevent invasion of the impurities into the gate electrode in forming the second source region.

8. A method of producing a semiconductor device according to claim 2, wherein;

forming the second source region is performed after the gate electrode is defined over the channel well region to prevent the second source region from being subjected to heat treatment for forming the gate electrode.

9. A method of producing a semiconductor device according to claim 1, wherein;

forming the second source region includes implanting impurities of the first conductivity type using the gate electrode as a mask.

* * * * *